(12) United States Patent
Chakravarthy

(10) Patent No.: US 6,795,519 B2
(45) Date of Patent: Sep. 21, 2004

(54) FRACTIONAL DIVIDER

(75) Inventor: Kalyana Chakravarthy, Delhi (IN)

(73) Assignee: SIMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/269,838

(22) Filed: Oct. 10, 2002

(65) Prior Publication Data

US 2003/0076137 A1 Apr. 24, 2003

(30) Foreign Application Priority Data

Oct. 10, 2001 (IN) .................................. 1041/DEL/2001

(51) Int. Cl.[7] .............................................. H03K 21/00
(52) U.S. Cl. ...................................................... 377/48
(58) Field of Search ............................................ 377/48

(56) References Cited

U.S. PATENT DOCUMENTS 3,959,737 A   5/1976   Tanis
4,573,176 A   2/1986   Yeager
5,714,896 A * 2/1998   Nakagawa et al. ......... 327/115
6,127,863 A   10/2000  Elliott
6,157,694 A   12/2000  Larsson

* cited by examiner

Primary Examiner—Margaret R. Wambach
(74) Attorney, Agent, or Firm—Lisa K. Jorgenson; Bryan A. Santarelli; Graybeal Jackson Haley LLP

(57) ABSTRACT

An improved fractional divider that comprises an integer value storage means containing the integer part of the division value 'K' connected to the input of a programmable counter means that is configured for a count value of 'K' or 'K+1' depending upon the state of a count control signal and generates the output signal as well a terminal count signal which is connected to an enable input of a fractional accumulator means that produces the count control signal on an addition overflow and has a first input connected to its result output and a second input connected to the output of a fractional value storage means, containing the fractional part of the divider value.

18 Claims, 2 Drawing Sheets

000000# FRACTIONAL DIVIDER

PRIORITY

This application claims priority from Indian Application for Patent No. 1041/Del/2001, filed Oct. 10, 2001, and entitled AN IMPROVED FRACTIONAL DIVIDER.

FIELD OF THE INVENTION

This invention relates to an improved fractional divider that is completely programmable, enables high resolution, and does not utilize any analog components.

BACKGROUND OF THE INVENTION

A fractional divider provides a precise division of an input clock signal by a real number value K that typically includes an integer value and a fractional value. Fractional dividers are widely used in frequency synthesizers and clock recovery circuits.

In these applications the fractional divider is designed to be programmable over a range of values. Often, it is also important to ensure that the output signal is stable—owing to which a purely digital solution is preferred over one that uses analog techniques.

U.S. Pat. No. 6,157,694 describes a fractional frequency divider that implements a fixed frequency division. The fractional division is obtained by changing the phase of the frequency to the divider. Multiple clock signals having the same frequency but differing in phase are generated from the input signal. A delay line can be used to produce the different clock phases. The multiple clock signals are applied to the inputs of a multiplexer. The output of the multiplexer is fed to a constant integer value divider. A Finite State Machine (FSM) controls the selection inputs of the multiplexer to selectively apply different clock signals at appropriate times to the input of the divider to obtain the fractional division. The FSM can be preprogrammed or programmable. This invention utilizes an analog approach, which may be prone to noise. Further, the resolution possible for using this approach is limited, as the number of phase-shifted clocks that can be generated in practical terms is limited.

U.S. Pat. No. 3,959,737 is related to field of frequency synthesis. It employs the method of clock inhibition to achieve fractional frequency division. The basic philosophy in working of the fractional division is inhibition of the clock pulse to a divider that stretches the output clock period. In this invention this is achieved by configuring the controllable pre-scaler to K or K+1. The pre-scaler control circuit ensures that the control pulse is generated so that there are no timing related issues in high-speed division. The programmable counter controls one of the inputs to the OR gate and periodically configures the pre-scaler in divide by K or K+1. The scheme is limited where a very-fine fractional division is required. To get a particular value of fractional division, programming of at least three registers is required. For some pre-defined fractional divisions a look up table is provided. But it becomes complex to manage the fractional divisions using software. All the counters are re-initialized after the count is complete. This does not allow a fractional factor to be carried out for subsequent divisions. This creates problems in applications where an accurate fractional division is required.

U.S. Pat. No. 4,573,176 employs a fractional divider that achieves a division factor of either 2 or 2+1/N. The division factor of 2+1/N is achieved by dropping a clock pulse every N clock cycles. The fractional divider consists of D-type flip-flops and OR gates. The D-flip-flop is configured as a divide by 2. The output of this flip-flop is the output of a fractional divider and is fed to a programmable divider. The programmable divider is configured for any division by the configuration bus. The flip-flop gives a divide by 2 clock to the programmable divider. The fractional divider is configured in 2+1/N mode when the mode control is at logic '0'. The clock input to the divide by 2 flip-flop is inhibited for one clock cycle in one division cycle. This effectively makes the programmable divider a 2N+1 divider, where N is the current programmed value in the programmable divider.

The disadvantage of this approach is that fractional division, as discussed in the '176 patent can be configured only as 2+1/N. This scheme cannot be used where the fractional division is to be dynamically configured.

U.S. Pat. No. 6,127,863 discusses an efficient fraction division algorithm. The patent deals with modifications in the conventional fractional division to get an efficient fractional division (EFD) of $M/(2^N+K)$. The EFD employs N full adders, where the output Y of the full adder is coupled to an associated one of N registers or accumulators. The output of each accumulator is fed back to input of the corresponding full adder. The full adder also includes another set of accumulators, which couple the carryout or the complimented carry out signals of the full adder back to the frequency control inputs of the full adders. The multiplexers are used to select whether carry signals or complimentary carry out signals or the external signals are to be fed back to the frequency control inputs. Depending on the feedback paths from the accumulator to the frequency control inputs of the full adders, the effective denominator value can be increased or decreased to obtain the desired conversion ratio. The EFD feedback paths are chosen in conjunction with the numerator input value. It is possible to increase the effective denominator by replacing an existing '1' in the numerator with a complimentary carry out signal. It is possible to decrease the denominator by replacing a '0' in the numerator with a carry out signal. The actual implementation of this fractional divider for a programmable application is very difficult. Firstly there has to be a big mutiplexer for connecting any of the carry out or complimentary carryouts to any of the inputs of the full adder. Programming the fractional divider for any increments in the fractional division involves lot of calculations. This makes this approach not suitable where the fractional division contents have to be dynamically changed for example clock recovery.

THE SUMMARY OF THE INVENTION

One embodiment of this invention obviates the above disadvantages by providing a complete digital implementation of the fractional divider and thereby avoiding delay lines and noise due to analog components.

Another embodiment of the invention has a flexible scheme wherein both the division value and the fractional part are dynamically programmable to achieve a better fractional least count.

Another embodiment of this invention makes technology migration much simpler by implementing the frequency divider in any HDL (Hardware Definition Language).

Another embodiment of the invention is an improved fractional divider that provides high resolution without the need for any analog components comprising:

an integer value storage containing the integer part of the division value 'K' connected to the input of a programmable counter that is configured for a count value of 'K' or 'K+1' depending upon the state of a count control signal and that generates the output signal as well a terminal count signal which is connected to an enable input of a fractional accumulator that produces a count control signal on an addition overflow and has a first input connected to its result output and a second input connected to the output of a fractional value storage, containing the fractional part of the divider value.

The said integer value storage is any digital value storage.

The said fractional accumulator is a multibit full adder, the number of bits depending on the desired resolution of said fractional divider.

The said digital value storage is a register.

The fractional value storage is any digital value storage.

The said digital value storage is a register.

The said integer value storage and said fractional value storage are connected to the data bus of a microprocessor or microcontroller based system for loading the integer part and fractional part of the division value respectively.

BRIEF DESCRIPTION OF THE DRAWINGS

The invention will now be described with reference to the accompanying drawings.

DETAILED DESCRIPTION OF THE PREFERRED EMBODIMENTS

Figure 1:
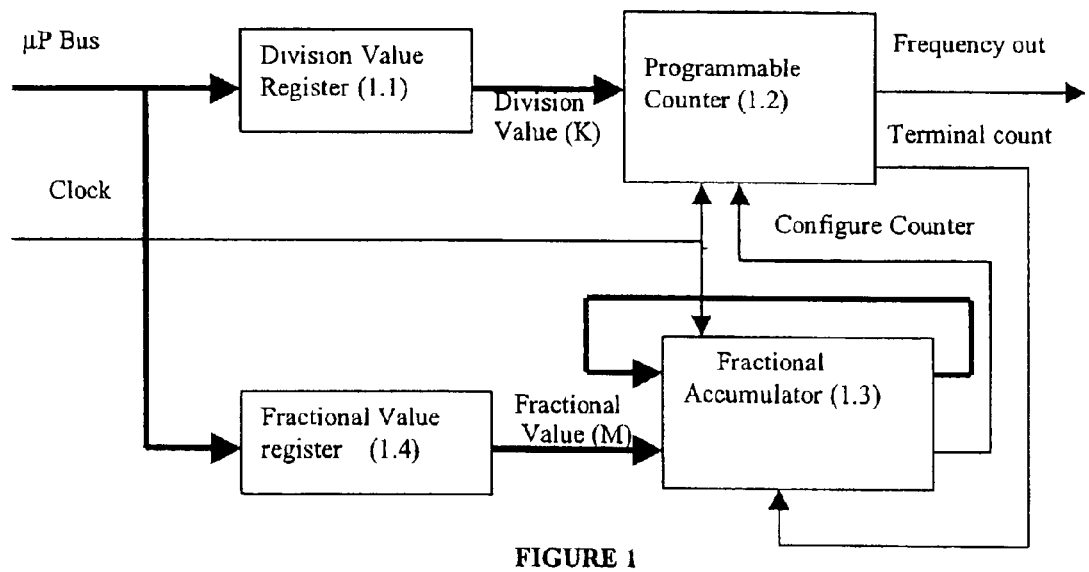
FIG. 1 shows the fractional divider together with its components, according to an embodiment of this invention.

FIG. 1 shows a fractional divider together with its components according to an embodiment of the invention. The fractional frequency divider essentially employs the classical method of clock inhibition to achieve fractional frequency division. The fractional divider includes a division value register (1.1), a programmable counter (1.2), a fractional accumulator (1.3) and a fractional value register (1.4) interconnected to each other. The divisional value register (1.1) and the fractional value register (1.4) interface to a microprocessor bus ($\mu$P). The microprocessor programs a value into these registers. A divisor or division value is selected having an integer part K and a fractional part F. 'K' is written into Division value register (1.1). The Programmable Counter (1.2) is configured to divide by 'K' when the Configure Counter signal is at logic 0. If the Configure Counter signal is at logic 1 the Programmable Counter is configured as divide by 'K+1'. The terminal count from the programmable counter (1.2) is at '1' when the count is equal to the value 'K' else it is at logic '0'. The programmable counter (1.2) is synchronously re-initialized when the terminal count is at logic '1'. Initializing the counter to 1 will configure the counter as divide by 'K', while initializing the counter to 0 will configure the counter to divide by 'K+1'. The Fractional accumulator (1.3) is a full adder, which processes only the fractional part of the division. The output of the fractional accumulator is fed back as one of its inputs. Also, the Programmable Counter (1.2) generates a first transition (here logic 0 to logic 1) of Frequency out when the count equals K/2, and an opposite transition (here logic 1 to logic 0) when the count equals K. The other input to it is the output of the fractional value register (1.4). The addition is performed on rising clock edge only when the terminal count is at '1' i.e., once every cycle of frequency out. The configure counter signal (output of fractional accumulator) is '1' only when an overflow in the accumulator occurs.

Figure 2:
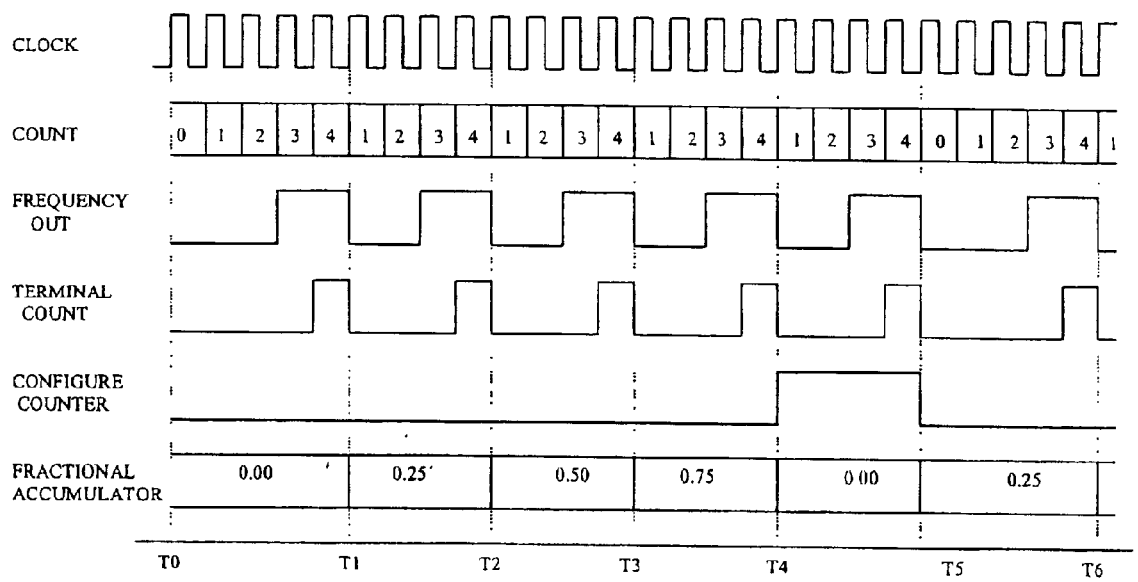
FIG. 2 explains the working of fractional divider, according to an embodiment of this invention.

FIG. 2 shows the working of the fractional divider with the help of a timing diagram, according to an embodiment of the invention. Let the requirement be of a fractional division of 4.25. To get this fractional division, program the 'division value register' with the value 4 and 'fractional value register' to 0.25 (01000000b). On reset at time T0, the accumulator is initialized to 0. At time T1, when the 'terminal count' is at logic '1' and there is a rising clock edge, the contents of 'fractional value register' are added to the accumulator. This process is repeated at time T2, T3 and T4. At time T4, adding 0.25 to the contents of accumulator (0.75) will result in an overflow. This overflow flag is connected to the Programmable Counter (1.2) as the Configure Counter signal. When Configure Counter is at '1', Terminal Count is at '1' and on rising clock edge the count value is loaded with 0. This configures the counter to divide by 5 (K+1).

The action of the counter (1.2) may be described us a modulo operation.

Accordingly, this invention is not to be considered limited to the specific examples chosen for purposes of disclosure, but rather to cover all changes and modifications, which are within the spirit and scope of the present invention. The invention is therefore not limited by the description contained herein or by the drawings, but only by the claims.

That which is claimed is:

1. A digitally implemented fractional divider for providing an output signal having a frequency that is a fraction of a frequency of an input clock signal, the divider comprising:

a programmable counter operable to count to a value K equal to the integer part of the fraction denominator when a count-control signal has a first state, and count to a value K+1 when the count-control signal has a second state, and operable to generate the output signal and a terminal count signal that is a function of the count value; and a fractional accumulator that is operable to receive the terminal count signal, a feedback of an accumulator output, and a fractional part N of the fraction denominator, and is operable to produce the count-control signal having the second state upon occurrence of an addition overflow.

2. The fractional divider of claim 1, further comprising a storage device operable to store K and N.

3. The fractional divider of claim 1, whereon the fractional accumulator comprises a multibit full adder having a selected number of bits, the number of bits being selected to achieve a desired resolution of the fractional divider.

4. The fractional divider of claim 1, where the fraction of a frequency is selectable.

5. A method for dividing the frequency of a clock signal by a divisor having an integer portion K and a fractional portion F, the method comprising:

updating a count value each cycle of the clock signal;

combining F with an accumulated value in response to the count value equaling K;

resetting the count value to a first number in response to the count value equaling K and no overflow of the accumulated value;

resetting the count value to a second number in response to the count value equating K and an overflow of the accumulated value; and generating an edge of a divided clock signal in response to the count value equaling K.

6. The method of claim 5 wherein:
the first number equals 1: and
the second number equals 0.

7. The method of claim 5 wherein combining F comprises adding F to the accumulated value.

8. The method of claim B wherein updating the count value comprises incrementing the count value by one each cycle of the clock signal.

9. The method of claim 6, further comprising generating an opposite edge of the divided clock signal in response to the count value equaling K/2.

10. The method of claim 6, where the divisor is selectable.

11. A method of providing an output signal that is selectable division of the frequency of a clock signal, the selectable division having an integer part K and a fractional part F, the method comprising the steps of:
providing the output signal having a division count value of K when a count-control signal has a first state and having a division count value of K+1 when the count control signal has a second state; and
changing the count-control signal from the first state to the second state for one cycle of the output signal when an addition overflow occurs, the addition overflow occurring by accumulating the fractional part F once for each output signal cycle having the division count value of K.

12. An improved fractional divider that provides high resolution without the need for any analog components comprising:
an integer value storage means containing the integer part of the division value 'K' connected to the input of a
programmable counter means that is configured for a count value of 'K' or 'K+1' depending upon the state of a count control signal and generates the output signal as well a terminal count signal which is connected to an enable input of a
fractional accumulator means that produces the count control signal on an addition overflow and has a first input connected to its result output and a second input connected to the output of a
fractional value storage means, containing the fractional part of the divider value.

13. An improved fractional divider as claimed in claim 12 wherein the integer value storage means is any digital value storage means.

14. An improved fractional divider as claimed in claim 12 wherein the fractional accumulator means is a multibit full adder having a number of bits depending on the desired resolution of the fractional divider.

15. An improved fractional divider as claimed in claim 13 wherein the integer storage means lea register.

16. An improved fractional divider as claimed in claim 12 wherein the fractional value storage means is any digital value storage means.

17. An improved fractional divider as claimed in claim 16 wherein the fractional value storage means is register.

18. An improved fractional divider as claimed in claim 12 wherein the integer value storage means and the fractional value storage means are connected to a data bum of a microprocessor based system for loading the integer part and fractional part of the division value respectively.

* * * * *

UNITED STATES PATENT AND TRADEMARK OFFICE
CERTIFICATE OF CORRECTION

PATENT NO. : 6,795,519 B2  Page 1 of 1
APPLICATION NO. : 10/269838
DATED : September 21, 2004
INVENTOR(S) : Kalyana Chakravarthy It is certified that error appears in the above-identified patent and that said Letters Patent is hereby corrected as shown below:

Column 4 line 64 should read: to the count value equaling K and an overflow of the

Column 5 line 6 should read: 8. The method of claim 5 wherein updating the count

Column 6 line 20 should read: wherein the integer value storage means is a register.

line 25 should read: wherein the fractional value storage means is a register.

line 28 should read: value storage means are connected to a data bus of a

Signed and Sealed this

Twenty-second Day of August, 2006

JON W. DUDAS
*Director of the United States Patent and Trademark Office*